United States Patent [19]

Schade, Jr.

[11] 3,887,878

[45] June 3, 1975

[54] TRANSISTOR SERIES AMPLIFIER

[75] Inventor: Otto Heinrich Schade, Jr., North Caldwell, N.J.

[73] Assignee: RCA Corporation, New York, N.Y.

[22] Filed: Mar. 4, 1974

[21] Appl. No.: 447,934

[52] U.S. Cl. .................... 330/13; 330/15; 330/17; 330/18; 330/20; 330/22; 330/40

[51] Int. Cl. .................... H03f 3/18

[58] Field of Search ............ 330/13, 15, 17, 18, 20, 330/22, 40

[56] References Cited

UNITED STATES PATENTS 3,484,709 12/1969 Kabrick .................... 330/18 X

*Primary Examiner*—James B. Mullins
*Attorney, Agent, or Firm*—H. Christoffersen; S. Cohen; A. L. Limberg

[57] ABSTRACT

Bias for the $n$ cascade connected output transistors of a conventional series amplifier is obtained by applying successive increments, each $1/n$ times the output voltage available across the series connected conduction paths of these transistors to the control electrodes of the successive transistors in the cascade, except for the one connected to the load terminal. Drive signal is applied to the control electrode of this transistor. In accordance with the present invention, the drive signal is supplied via $n$ cascade connected input transistors biased in similar fashion to the cascade connected output transistors, to develop across its conduction path a voltage approximately equal to $1/n$ times the amplifier output voltage. This way of applying drive signal to the series amplifier facilitates its connection with another series amplifier in push-pull amplifier configurations.

18 Claims, 3 Drawing Figures

TRANSISTOR SERIES AMPLIFIER

Figure 2:
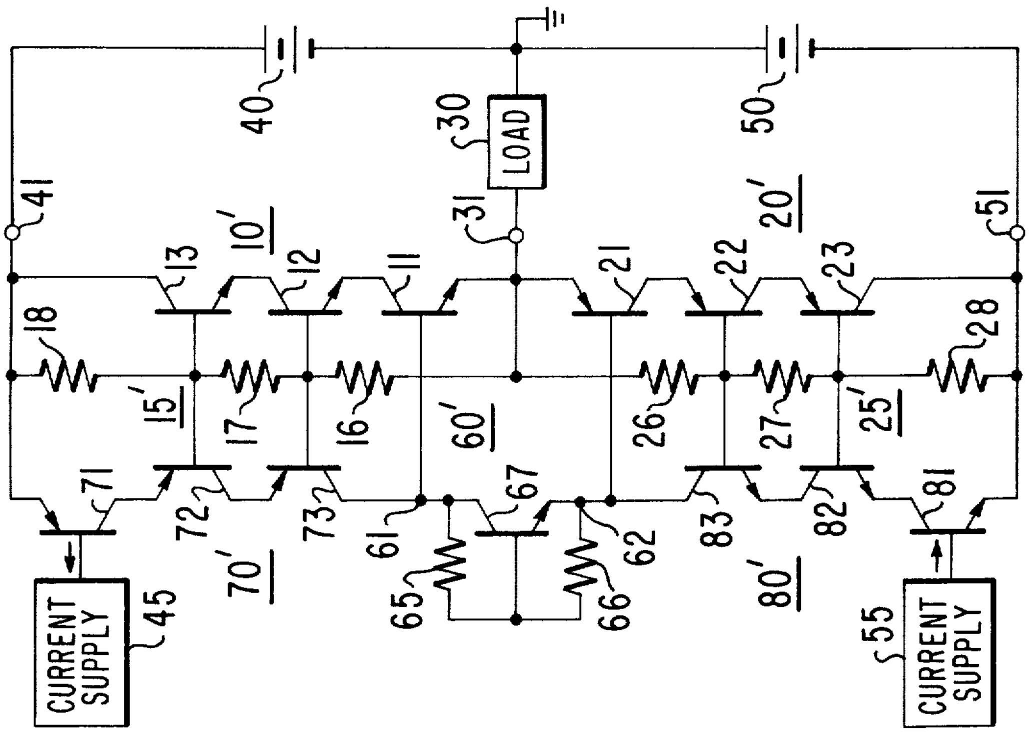

The present invention relates to transistor series amplifiers and, more particularly, to means for providing drive signals to these amplifiers.

A quasi-linear amplifier is an amplifier which produces an output signal proportionally related to its input signal over a range, although the signals at individual stages within the amplifier as so related over only a portion of that range. Class B push-pull amplifiers in which one of the amplifiers is operative only for positive portions of output signal and the other of the amplifiers is operative only for negative portions of output signals are quasi-linear amplifiers. So, too, are Class AB push-pull amplifiers which are similar to Class B push-pull amplifiers except that the operating ranges of the amplifiers overlap slightly to reduce "cross-over" distortion which may otherwise occur during transitions from the operating range of the one amplifier to that of the other.

Series amplifiers are known of the type in which a number of similar transistors have their collector-to-emitter paths in serial connection to provide the amplifier output circuit. Drive signal is applied between the base and emitter electrodes of the transistor having its electrode at an end of the serial connection. A resistive potential divider has its input circuit connected to the amplifier output circuit, has taps to which the base electrodes of the remaining transistors are connected and is arranged to proportion the signal potential appearing across the amplifier output circuit equally amongst the collector-to-emitter paths of its component transistors. Such a series amplifier has the advantage that its output signal can swing over a range of potential as large as the sum of the collector-to-emitter breakdown potentials of its component transistors.

In the past, series amplifiers have usually been operated Class A rather than operated in push-pull with other series amplifiers. Such a series amplifier is conventionally operated wiwth a first of its transistors in common-emitter configuration and with the others connected in cascade thereafter. The emitter electrode of the first transistor is connected to a supply potential and input signal is applied to its base electrode. Therefore, a driver transistor which precedes the series amplifier does not have to supply drive signal with large potential swings.

In push-pull operation of series amplifiers where transformers are not used and where the series amplifiers are serially connected, the emitter electrode of the first transistor is often connected to the load and follows the output signal swings. Consequently, the driver amplifier preceding the series amplifier must be capable of providing a drive signal ranging over substantially the same potential range as the output signal. This means the operating potential of the driver amplifier must be as large as the range of output signal and presents the problem of avoiding collector-to-emitter breakdown and/or collector-to-base breakdown of transistors in the driver amplifier. One solution, in discrete, Class B push-pull operated serial amplifiers is to employ medium current capability driver transistors with higher collector-to-emitter breakdown characteristics than those of the following power transistors.

In integrated circuit design, however, this freedom usually does not exist. Since all transistors in an integrated-circuit amplifier are formed by the same series diffusion or ion implantation steps, all the transistors of the same conductivity type have substantially the same collector-to-emitter breakdown potential characteristics. While it is desirable to use high resistivity semiconductive material in the transistors to obtain the capability of sustaining high collector-to-base and collector-to-emitter potentials without breakdown occurring, the resistivity of the semiconductive material must be kept within limit to retain sufficiently low saturation resistance in the output devices. Even in discrete-element designs, the solution suggested in the preceding paragraph may be inadequate when series amplifiers are designed to handle output signal potential swings exceeding two hundred volts or so. Further, higher breakdown potential transistors are generally more expensive than standard types. So, a discrete-element driver circuit for push-pull series amplifiers may be more economical to build if its design places no more than modest breakdown potential requirements upon its component transistors.

The present invention is embodied in a series amplifier to which drive signal is supplied via a cascade connection of transistors, biased by means of apportionment from the output signal voltage of the series amplifier.

Figure 1:
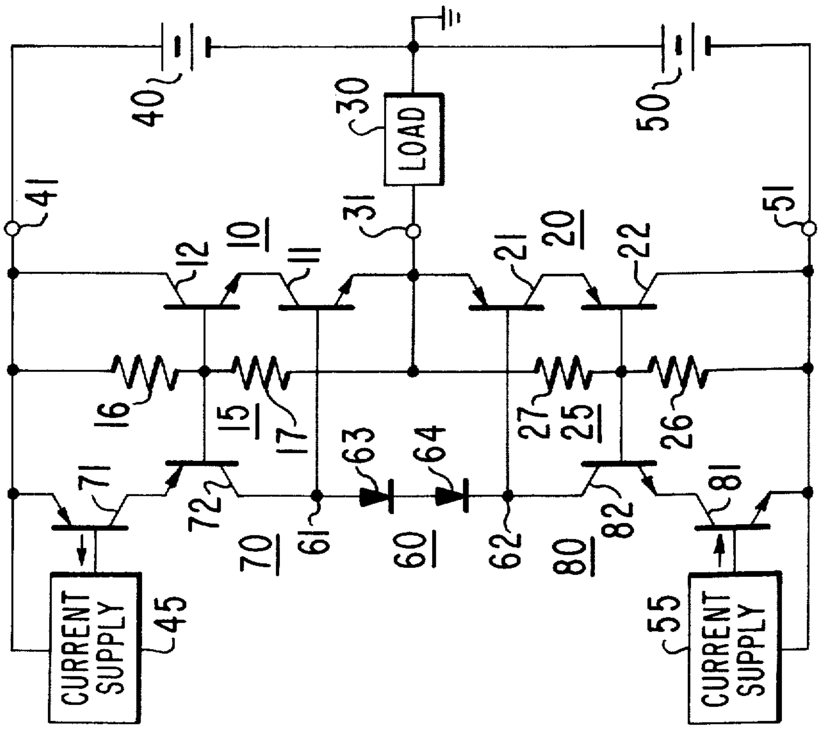
Figure 3:
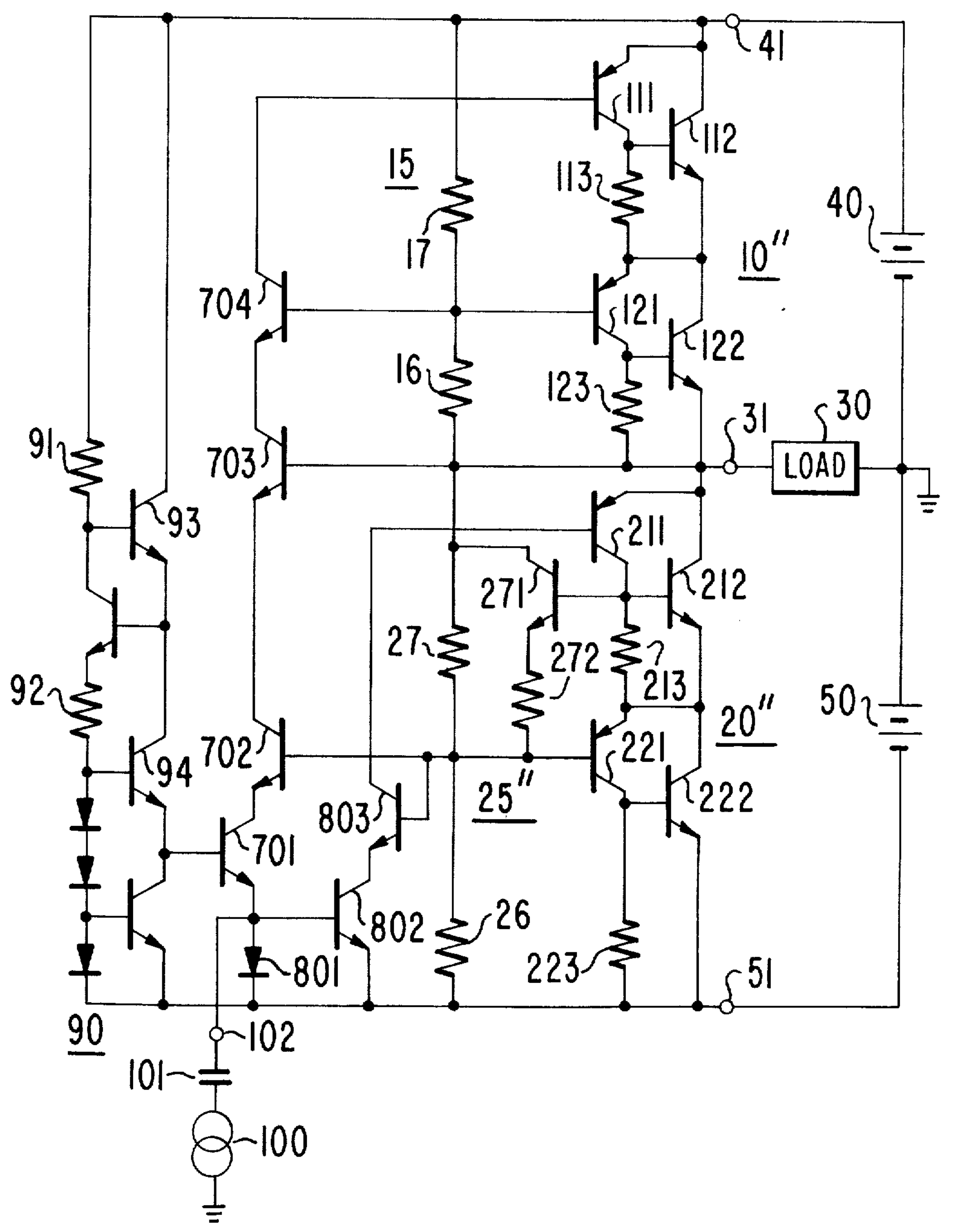

In the drawing:

FIGS. 1, 2 and 3 are schematic diagrams of push-pull amplifiers, each of which includes series amplifiers embodying the present invention.

In FIG. 1, series amplifiers 10 and 20 are connected in push-pull to provide output signal to a shared load 30.

Series amplifier 10 comprises NPN transistors 11 and 12 and a potential divider 15, which divider is shown as comprising serially-connected resistors 16 and 17 having approximately equal resistances. The output circuit of series amplifier 10 comprises the collector-to-emitter paths of transistors 11 and 12 serially connected between a terminal 41, to which a positive direct operating potential from supply 40 is connected, and an output terminal 31, to which load 30 is connected.

Potential divider 15 places a potential on the base electrode of transistor 12 which is substantially midway between the potentials appearing at terminals 31 and 41. By emitter-follower action, the potential at the emitter electrode of transistor 12 is also substantially midway between the potentials appearing at terminals 31 and 41, so the collector-to-emitter potentials of transistors 11 and 12 are regulated to be substantially equal to each other irrespective of the current flow through their serially connected collector-to emitter paths and irrespective of the potential between terminals 31 and 41. Thus, the potential appearing between terminals 31 and 41 can åpproach the sum of the collector-to-emitter breakdown potentials of transistors 11 and 12 without such breakdown actually occurring, that is, because of the balanced conditions just described, one-half of the voltage between terminals 31 and 41 will appear across each transistor. The current flow through the collector-to-emitter path of transistor 11 is determined by the current applied to its base electrode, and the collector current of transistor 11 determines the emitter current flowing in the emitter-follower transistor 12.

Series amplifier 20 comprises PNP transistors 21 and 22 and a potential divider 25, which divider is shown as comprising resistors 26 and 27 having approximately equal resistances. Series amplifier 20 operates analagously to series amplifier 10 thereby to keep the potential at the emitter electrode of transistor 22 midway between the potential at terminal 51, to which a negative direct operating potential from supply 50 is connected, and the potential at terminal 31. This keeps the collector-to-emitter potentials of transistors 21 and 22 about one-half as large as the potential appearing between terminals 31 and 51 and helps to avoid exceeding the collector-to-emitter breakdown potential ratings of transistors 21 and 22.

A network 60 provides a potential offset between nodes 61 and 62 to which the separate base electrodes of transistors 11 and 21 are respectively connected. The network 60 may, as shown, comprise serially connected diodes 63 and 64 arranged to be forward biased by currents applied to nodes 61 and 62. The offset potential developed across network 60 provides a slight forward bias to the base-emitter junctions of transistors 11 and 12 during idle conditions when the output signal at terminal 31 does not vary from an average value midway between the operating potentials applied to terminals 41 and 51. This slight forward bias, as known, avoids cross-over distortion which would otherwise occur during transitions from relatively large conduction of transistors 11 and 12 as compared to that of transistors 21 and 22, to a relatively large conduction of transistors 21 and 22 compared to that of transistors 11 and 12, or vice versa.

(Alternatively, network 60 may take the form 60′ shown in FIG. 2. Therein, the potential between nodes 61 and 62 is divided in the resistive potential divider formed by resistors 65 and 66 to provide degenerative collector-to-base feedback to transistor 67. This degenerative feedback regulates the collector-to-emitter potential of transistor 67 to be substantially equal to its base-emitter potential multiplied by the ratio of the combined resistances of resistors 65 and 66 divided by the resistance of resistor 66.)

Current supplies 45 and 55 supply input currents which are amplified in cascode amplifiers 70 and 80, respectively. The amplified currents are supplied from cascode amplifiers 70 and 80 to nodes 61 and 62, respectively. Substantial portions of these amplified currents are interchanged during quiescent conditions, causing a quiescent current flow from cascode amplifier 70 to cascode amplifier 80 through diodes 63 and 64 of network 60 which gives rise to the offset potential used to slightly forward bias the base-emitter junctions of transistors 11 and 21. At least one of the input currents provided by curret supplies 45 and 55 is modulated to give rise to an amplifier drive current, and they may be modulated in push-pull with each other.

When the amplified input current supplied from cascode amplifier 70 to node 61 exceeds the amplified input current withdrawn by cascode amplifier 80 from node 62, the excess current flows as base current to transistor 11 increasing its conductivity. This, in turn, increases the conductivity of transistor 12, also because of its series amplifier connection 10 with transistor 11. The increased conductivity of transistors 12 and 11 results in current flow through output terminal 31 to a load 30. Presuming load 30 to exhibit impedance to the current applied to it, the potential at terminal 31 will rise in value in accordance with Ohm's Law. During these conditions, no current is applied to the base electrode of transistor 21, so it and (by virtue of the series amplifier connection 20) transistor 22 are non-conductive.

On the other hand, when the amplified input current required from node 62 by cascode amplifier 80 exceeds the amplified input current supplied to node 61 by cascode amplifier 70, the excess current is withdrawn as base current from transistor 21. This places transistor 21 into increased conduction which, in turn, because of the series amplifier connection 20, also places transistor 22 into increased conduction. Current is withdrawn from load 30 via terminal 31 to supply the current demand posed by the increased conductivity of the serially-connected collector-to-emitter paths of transistors 21 and 22. Presuming load 30 to exhibit impedance to the flow of the current withdrawn from it, the potential at terminal 31 will drop in accordance with Ohm's Law. During these conditions, no current is supplied to the base electrode of transistor 11, and it and transistor 12 are non-conductive.

In transistor circuitry, a cascade amplifier 70 (or 80) comprises a transistor 71 (or 81) connected as a common-emitter amplifier and another transistor 72 (or 82) connected as a common-base amplifier in cascade thereafter. Insofar as signal is concerned, the common-base amplifiers 72 and 82 conduct the collector currents of transistors 71 and 81, respectively, to nodes 61 and 62, respectively, without substantial attenuation. Only small portions of the collector currents are diverted to flow as base currents of transistors 72 and 82, respectively. Cascode amplifier connections conventionally are used to obtain wideband amplifiers by eliminating Miller feedback. In the present application, however, the common-base amplifier transistors 72 and 82 are used primarily for avoiding the problem of collector-to-emitter breakdowns of the common-emitter transistors 71 and 81. In the absence of these transistors 72 and 82, the emitter-to-collector paths of transistors 71 and 81 would be subjected to the full signal swing present between nodes 61 and 41, and 62 and 51, respectively.

The conduction of the base-emitter junction of transistor 11 or 21 and of network 60 maintain node 61 a few tenths of a volt more positive in potential than terminal 31 and maintain node 62 a few tenths of a volt more negative in potential than terminal 31. The sum of the collector-to-emitter breakdown potentials to which transistors 71 and 72 are subjected is the same as the sum of the collector-to-emitter potentials to which transistors 11 and 12 are subjected. Therefore, apportionment of collector-to-emitter potentials to transistors 71 and 72 and may be accomplished by connecting the base electrode of the common-base amplifier transistor 72 to an output tap of the potential divider 15. By connecting the base electrode of transistor 72 to the interconnection of equal-resistance resistors 16 and 17, its potential is maintained substantially midway between those appearing at terminals 31 and 41, respectively. By emitter follower action, the emitter electrode of transistor 72 is also maintained at a potential substantially midway between these appearing at terminals 31 and 41, respectively. Since the potential between terminal 41 and node 61 is similar to the potential between terminals 41 and 31, this causes like collector-to-emitter potentials to obtain for transistors 71 and 72.

Similarly, the collector-to-emitter potentials of transistors 81 and 82 may be caused to be alike by connecting the base electrode of common-base amplifier transistor 82 to an output tap of the potential divider 25.

While the variation of the base currents of transistors 12 and 22 will introduce slight perturbations of potential at the output taps of their respective resistive potential dividers 15 and 25, these perturbations will not cause regenerative feedback of any consequence when applied to the base electrode of the common-base amplifier transistors 72 and 82, respectively. This is because the collector electrodes of transistors 71 and 81 present very high emitter impedances to transistors 72 and 82, respectively, thereby highly degenerating their common-emitter amplifier gain. The effects of the variations of the base currents of transistors 72 and 82 upon the potentials provided by potential dividers 15 and 25, respectively, to the base electrodes of transistors 12 and 22, respectively, is not substantial since the base currents of transistors 72 and 82 are relatively small. Further, the current flows from the base electrode of transistor 72 to the base electrode of transistor 12 and from the base electrode of transistor 82 to the base electrode of transistor 22 are not of a regenerative nature.

While the potential dividers 15 and 25 are shown as comprising only resistive elements, they may also include diode elements. Also, potential dividers employing feedback amplifiers to obtain low source impedance for divided potential at relatively low current levels may replace the passive, resistive potential dividers. The use of the same potential divider 15 (or 25) to bias both a series amplifier 10 (or 20) and a cascade connection 70 (or 80) provides an economy, not only of parts, but also of thermal dissipation in biasing networks. Both of these economies are highly desirable when a circuit is constructed in integrated form.

However, without departure from the spirit of the present invention, separate potential dividers having parallelled input circuits may replace the single potential divider 15 (or 25), the output tap the one being used for determining the base potential of transistor 12 (or 22), and the output tap of the other being used for determining the base potential of transistor 72 (or 82).

FIG. 2 illustrates how the present invention permits output signal voltage swings which can range, not only up to twice the collector-to-emitter breakdown potentials of each of transistors 11, 12, 21, 22, 71, 72, 81, 82, but up to higher multiples of this breakdown potential (three times in the example shown). Series amplifiers 10 and 20 are modified to form amplifiers 10′ and 20′ by the inclusion in the output circuit of each of the collector-to-emitter paths of another transistor (13 or 23, respectively). Cascode connections 70 and 80 are modified to form connections 70′ and 80′ by the inclusion in each of a further common-base amplifier transistor (73 and 83, respectively) in cascade after the cascode connection. Each of the potential dividers 15 and 25 is modified to divide the potential applied to its input circuit into thirds rather than halves. These potentials are applied to the base electrodes of the emitter-follower transistors of the series amplifiers 10′ and 20′ to make the collector-to-emitter potentials of the transistors in each of the series amplifiers substantially equal to each other. Also, these potentials are applied to the base electrodes of the common-base amplifier transistors of the modified cascode connections 70′ and 80′ to make the collector-to-emitter potentials of the transistors in each of the connections 70′ and 80′ substantially equal to each other.

In general, the output signal voltage swing capability of a quasi-linear amplifier of the type shown in FIGS. 2 and 3 can be made to be any integral multiple *n* of the collector-to-emitter breakdown potentials of its transistors, assuming them to be alike. To do this, each of the series amplifiers is arranged to have the collector-to-emitter paths of *n* transistors in its output circuit. Each of the (modified) cascode connections is arranged with n transistors in cascade, the first being connected as a common-emitter or common-base amplifier and the rest connected as common-base amplifiers thereafter. Potential dividers are arranged to divide the output potential swings of each series amplifier into *n* parts and to bias the transistors in the series amplifiers and in the (modified) cascode connections so as to apportion potential swings substantially equally amongst them.

In some designs, the transistors used in a cascode or modified driver amplifier may have a different collector-to-breakdown potential than the transistors used in the series amplifier biased from the same potential divider. In such instance, a different number of transistors may be used in the than is used in the series amplifier. If this is so, the output taps of the potential divider to which the base electrodes of the common-base amplifier transistors of the driver amplifier are connected will then be different output taps from those to which the base electrodes of the emitter-follower transistors in the series amplifier are connected. Differences between the collector-to-emitter breakdown potentials of the complementary transistors used in the series output amplifiers (10, 20) can be accomodated by proportioning their potential dividers according to the number of transistors required in each of them. Similar design accomodations can be made with respect to the cascade connections (70, 80).

In the FIG. 3 amplifier, series amplifiers 10″ and 20″ are of a similar rather than complementary nature insofar as conductivity is concerned. The connection of transistors 111 and 112 functions as a composite PNP transistor having its equivalent base electrode at the base electrode of transistor 111, having its equivalent emitter electrode at the joined emitter electrode of transistor 11 and collector electrode of transistor 12, and having its equivalent collector electrode at the emitter electrode of transistor 112. Transistors 121 and 122 together form a similar composite PNP transistor. So do transistors 211 and 212 and do transistors 221 and 222. Resistors 113, 123, 213 and 223 are used to speed the turning off of transistors 112, 122, 212 and 222, respectively, in response to transistors 111, 121, 211 and 221, respectively, being turned off. (Composite PNP transistor circuits may be used to realize the PNP transistors shown in the amplifiers of FIGS. 1 and 2, and in the Claims, the term "transistor" is to be construed to comprise known composite transistor circuits—e.g., of this type and of the Darlington type.)

Network 90, including resistors 91 and 92 similar in resistance to each other so as to apportion supply potential evenly between the collector-to-emitter paths of transistors 93 and 94 is used to apply a potential to the base electrode of transistor 701. This potential is such as to maintain a slight quiescent forward bias on the base-emitter junction of transistor 701, on diode 801 and on the base-emitter junction of transistor 802. Elements 701, 801 and 802 act as a phase-splitter to convert input currents conducted from input signal source 100 via coupling capacitor 101 to terminal 102 into Class B collector currents from transistors 701 and 802, which currents are in push-pull relationship with each other, and may be applied as shown or conversely so. This type of phase-splitter is described in detail in U.S. Pat. No. 3,573,645 issued Apr. 6, 1971, to C. F. Wheatley, Jr., entitled "Phase-Splitting Amplifier" and assigned, like the present application, to RCA Corporation.

When transistor 701 demands collector current in response to input signal from source 100, this demand is coupled via common-base amplifier transistors 702, 703, and 704 to the base electrode of transistor 121. Transistors 111 and 112 are rendered conductive in response to the base current withdrawn from transistor 11. Subsequently, transistors 121 and 122 are rendered conductive by virtue of their series amplifier connection 10″ with transistors 111 and 112. At the same time, transistor 802 will demand no collector current from the emitter electrode of transistor 803, so there will be no collector current withdrawn by transistors 803, from the base electrode of transistor 211, and the transistors in series amplifier 20″ will be non-conductive. For a load 30 exhibiting impedance, the conduction of the transistors in series amplifier 10″ will therefore reduce the potential difference between terminals 31 and 41, and permit an increase of the potential difference between terminals 51 and 31.

The potentials developed across resistor 16 and 17 of potential divider 15 will be reduced proportionately to the potential between terminals 31 and 51. The collector-to-emitter potentials of transistors 703 and 704 will be substantially equal to the potentials developed across resistors 16 and 17, respectively, and the reduced collector-to-emitter potentials obviate breakdown of transistors 703 and 704. As the potential at terminal 31 approaches that applied to terminal 41, the emitter electrode of transistor 703 and the base electrode of transistor 211 follow, in potential, except for the small offset potentials across the base-emitter junctions of these transistors. Were the collector electrodes of transistors 701 and 802 directly connected to the emitter electrode of transistor 703 and the base electrode of transistor 211, transistors 701 and 802 would be subjected to collector-to-emitter potentials sufficiently large to cause their breakdown. This breakdown is precluded, however, by the inclusion of common-base amplifier transistors 702 and 803 in respective ones of these connections. Potential divider 25″ splits the potential appearing between terminals 51 and 31 to provide base potential to transistors 702 and 803, to cause the collector-to-emitter potentials to which transistors 701, 702, 802, and 803 are subjected never to exceed one-half the combined potentials of supplies 40 and 50.

When transistor 802 demands collector current in response to input signal from source 100, this demand is coupled via common-base amplifier transistor 803 to the base electrode of transistor 211. Transistors 211 and 212 are rendered conductive in response to the base current withdrawn from transistor 211. Subsequently, transistors 221 and 222 are rendered conductive by virtue of their series amplifier connection 20″ with transistors 211 and 212. At the same time, transistor 702 will demand no collector current to cause conduction of the transistors in series amplifier 1C″. For a load 30 exhibiting impedance, the conduction of the transistors in series amplifier 20″ will therefore reduce the potential difference between terminals 31 and 51 and permit an increase of the potential between terminals 31 and 41.

The potentials developed across resistors 26 and 27 of potential divider 25″ are reduced proportionately to the potential between terminals 31 and 51 until this potential is reduced to a value smaller than the potential provided by supply 50. Thereafter, continued reduction of the potential across resistor 26 would at some point cause the base potentials of transistors 702 and 803 to be insufficiently positive with respect to the potential at terminal 31 for their respective emitter-follower actions to maintain the reverse bias required on the collector-base junctions of transistors 701 and 802. This outcome is forestalled by the inclusion of transistor 271 and resistor 272. When transistor 211 becomes conductive as the potential across terminal 31 swings negative, the collector current of transistor 211 develops sufficient potential drops across resistor 213 to bias transistor 271 into conduction. Resistor 272 is of sufficiently small resistance that more current flows through it and the collector-to-emitter path of transistor 271 than through resistor 27 when the output signal potential at terminal 31 is negative. This action reduces the potential drop across resistor 27 as compared to the potential drop across resistor 26. Accordingly, the base potentials of transistors 702 and 803 are maintained positive with respect to terminal 51 over a much increased range of output signal swing.

As the potential at terminal 31 approaches that applied to terminal 51, the combined potentials of supplies 40 and 50 appear across the serial connection of the base-emitter junction of transistor 211 and the collector-to-emitter potentials on transistors 704 and 703. This condition applies the maximum collector-to-emitter potentials on transistors 703 and 704. The tendency for forward conduction through the base-emitter junction of transistor 111 maintains the collector potential of transistor 704 with a few tenths of a volt of the potential at terminal 41. Emitter-follower action maintains the emitter electrode of transistor 703 within a few tenths of the potential at terminal 31. Potential divider 15 maintains the base electrode of transistor 704 midway between the potentials appearing at terminals 31 and 41, so the collector-to-emitter paths of transistors 703 and 704 need to withstand at most only about one-half the combined potentials of supplies 40 and 50.

Amplifiers of the type shown in FIGS. 1 and 2 may be constructed using a common-base amplifier transistor in place of either or each of the transistors 71 and 81. The base electrodes of such common base amplifiers replacing transistors 71 and 81 would be biased to potentials similar to those appearing at terminals 41 and 51, respectively. In such amplifiers adequate collector potential can be supplied to the common bas amplifier transistor which replaces transistor 71 or 81 by modifying the potential divider action of the potential divider biasing the base electrode of the common-base amplifier transistor 72 or 82 cascaded thereafter, such modification being made in similar manner as elements 271 and 272 are used to modify the potential divider action of potential divider 25″ in the FIG. 3 amplifier. Amplifiers of the type shown in FIGS. 1 and 2 may also be constructed using a common-collector amplifier transistor of complementary conductivity type instead of common-emitter amplifier trannsistor 71 or 81. Amplifiers of the type shown in FIGS. 1 and 2 may also be constructed using a common-collector amplifier transistor of complementary conductivity type instead of common-emitter amplifier transistor 71 or 81. While the embodiments of the invention which have been described are push-pull configurations operable as quasilinear amplifiers, circuitry of the type described is useful for providing drive signal to a conventional Class A series amplifier. Push-pull Class A amplification can be obtained in configurations similar to those shown in FIGS. 1 and 2 except for the omission of networks 60 and 60', respectively.

Amplifiers similar to those shown in FIGS. 1, 2 and 3, but using field-effect transistors (FET's) rather than bipolar transistors, may embody the present invention. In the claims, the terms "input electrode" and "control electrode" are intended to be generic to the gate electrode of an FET or the base electrode of a bipolar transistor; the term "common-electrode" is intended to be generic to the source of an FET or the emitter electrode of a bipolar transistor; the term "output electrode" is intended to be generic to the drain electrode of an FET or to the collector electrode of a bipolar transistor; and "principal conduction path" is intended to be generic to the drain-to-source path of an FET or to the collector-to-emitter path of a bipolar transistor. The terms input electrode, common electrode and output electrode, with regard to composite transistors refer to electrodes functionally corresponding to those set forth in the preceeding definitions.

What is claimed:

1. An amplifier comprising:

first and second terminals;

a first plurality of transistors ordinally numbered first through last, all of the same conductivity type, each having an input electrode and having common and output electrodes with a variably conductive path therebetween responsive to signal between its input and common electrodes, said variably conductive paths thereof being serially connected in a first succession determined according to the numbering of the transistors, said first succession being connected between said first and said second terminals so the common electrode of the first transistor thereof is connected to said first terminal and so the output electrode of the last transistor thereof is connected to said second terminal;

a second plurality of transistors, ordinally numbered first through last, at least those following the first being of opposite conductivity type to those of said first plurality, each having an input electrode and each having common and output electrodes with a variably conductive path therebetween responsive to signal between its input and common electrodes, said variably conductive paths thereof being serially connected in a second succession determined according to the numbering of the transistors, said second succession being connected between said second terminal and the input electrode of said first transistor of said first plurality with the output electrode of the last transistor in said second plurality connected to the input electrode of the first transistor of said first plurality;

means for apportioning the potential appearing between saidd first and said second terminals and applying the successive portions thereof to the input electrodes of the successive transistors following said first transistor in said first succession, thereby to secure by the common electrode follower action of the transistors following said first transistor in said first succession substantially equal potentials across the variably conductive paths in said first succession, and for apportioning the potential appearing between said second and said first terminals and applying the successive portions thereof to the input electrodes of the successive transistors following the first transistor in said second succession thereby to secure by the common electrode follower action of the transistors following said first transistor in said second succession substantially equal potentials across the variably conductive paths in said second succession; and means for applying an input signal between the input and common electrodes of said first transistor of said second plurality.

2. An amplifier as set forth in claim 1 wherein said first transistor of said second plurality is of the opposite conductivity type to those of said first plurality and is connected in a common-emitter amplifier configuration.

3. An amplifier as set forth in claim 1 wherein said first transistor of said second plurality is of the opposite conductivity type to those of said first plurality and is connected in a common-base amplifier configuration..

4. An amplifier as set forth in claim 1 wherein said means for apportioning the potential appearing between said first and said second terminals and applying the successive portions thereof to the input electrodes of the successive transistors following said first transistor in said first succession and for apportioning the potential appearing between said second and said first terminals and applying the successive portions thereof to the base electrodes of the successive transistors following the first transistor in said second succession comprises:

a potential divider having an input circuit connected between said first and said second terminals and having a plurality of output taps respectively connected to separate ones of the input electrodes of the transistors in said first and said second pluralities except the first transistors in both of said first and said second pluralities.

5. An amplifier as set forth in claim 4 further including:

an auxiliary transistor having an input electrode and having common and output electrodes with a variably conductive path therebetween, responsive to signal between its input and common electrodes, the variably conductive path of said auxiliary transistor being connected between said first terminal and the input electrode of the last transistor of said second plurality, the input electrode of said auxiliary transistor being connected to a point in said first succession, whereby an increase of the conductivity of the variably conductive paths in said first succession above a predetermined level causes the variably conductive path of said auxiliary transistor to become conductive thereby to alter the division ratio of said potential divider with respect to the base potential of the second transistor of said second plurality to raise the potential across the variably conductive path of said first transistor of said second plurality.

6. An amplifier comprising:

first and second terminals;

a first plurality of transistors ordinally numbered first through last, all of the same conductivity type, each having an input electrode and having common and output electrodes with a variably conductive path therebetween responsive to signal between its input and common electrodes, said variably conductive paths thereof being serially connected in a first succession determined according to the numbering of the transistors, said first succession being connected between said first and said second terminals so the common electrode of the first transistor thereof is connected to said first terminal and so the output electrode of the last transistor thereof is connected to said second terminal;

a second plurality of transistors, numbered first through last, at least those following the first being of opposite conductivity type to those of said first plurality, each having an input electrode and each having common and output electrodes with a variably conductive path therebetween responsive to signal between its input and common electrodes, said variably conductive paths thereof being serially connected in a second succession determined according to the numbering of the transistors, said second succession being connected between said second terminal and the input electrode of said first transistor of said first plurality with the collector electrode of the last transistor in said second plurality connected to the input electrode of the first transistor of said first plurality;

means for apportioning the potential appearing between said first and said second terminals and applying the successive portions thereof to the base electrodes of the successive transistors following said first transistor in said first succession thereof, thereby to secure by the common electrode follower action of the transistors following said first transistor in said first succession substantially equal potentials across the variably conductive paths in said first succession, and for apportioning the potential appearing between said second and said first terminals and applying the successive portions thereof to the base electrodes of the successive transistors following the first transistor in said second succession, thereby to secure by the common electrode follower action of the transistors following said first transistor in said second succession substantially equal potentials across the variably conductive paths in said second succession; and means for supplying a current to the input electrode of said first transistor of said second plurality.

7. An amplifier comprising:

first and second terminals for connection to a power supply;

a third terminal for connection to a load;

a first plurality of transistors of a first conductivity type ordinally numbered first through last, each having an input electrode and having common and output electrodes with a variably conductive path therebetween responsive to signal between its input and common electrodes, their variably conductive paths being serially connected in order of their numbering between said third and said first terminals, so the common electrode of the first transistor is connected to said third terminal and so the output electrode of said last transistor is connected to said first terminal;

a second plurality of transistors, numbered first through last, at least those following the first being of a second conductivity type complementary to the first conductivity type, each having an input electrode and having common and output electrodes with a variably conductive path therebetween responsive to signal between its input and common electrodes, said variably conductive paths thereof being serially connected in order of their numbering between said first terminal and the base electrode of said first transistor of said first plurality, so the collector electrode of the last transistor in said second polarity is connected to the base electrode of the first transistor of said first plurality;

a third plurality of transistors of said second conductivity type, ordinally numbered first through last, each having an input electrode and having common and output electrodes with a variably conductive path therebetween responsive to signal between its input and common electrodes, said variably conductive paths thereof being serially connected in order of their numbering between said third and said second terminals, so the common electrode of the first transistor thereof is connected to said third terminal and so the output electrode of the last transistor thereof is connected to said second terminal;

a fourth plurality of transistors, numbered first through last, at least those following the first being of said first conductivity type, each having an input electrode and each having common and output electrodes with a variably conductive path therebetween responsive to signal between its input and common electrodes, said variably conductive path thereof being serially connected in order of their numbering between said second terminal and the base electrode of said first transistor of said third plurality, so the collector electrode of the last transistor in said fourth plurality is connected to the base electrode of the first transistor of said third plurality;

means for applying bias to the input electrodes of the first transistors in said second plurality and in said fourth plurality;

means for applying an input signal between the input and common electrodes of at least one of the first transistors in said second plurality and in said fourth plurality;

a first potential divider having an input circuit connected between said first and said third terminals and having a plurality of output taps each connected to a respective one of the base electrodes of the transistors in said first and said second pluralities except the first transistors thereof, thereby to apportion substantially equal potentials to the variable conductivity paths of the transistors in said first plurality and substantially equal potentials to the variable conductivity paths of the transistors in said second plurality; and a second potential divider having an input circuit connected between said second and said third terminals and having a plurality of output taps each connected to a respective one of the base electrodes of the transistors in said third and fourth pluralities except the first transistors thereof, thereby to apportion substantially equal potentials to the variably conductive paths of the transistors in said third plurality and substantially equal potentials to the variably conductive paths of the transistors in said fourth plurality.

8. An amplifier as set forth in claim 7 having:

direct current conductive means connected between the base electrodes of the first transistors of said first and said third pluralities of transistors for establishing quasi-linear operation thereof.

9. An amplfier as set forth in claim 7 wherein at least one of the first transistors of said second and said fourth pluralities is of the same conductivity type as the rest of the transistors in that plurality and is connected in a common-emitter amplifier configuration.

10. An amplifier comprising:

first and second terminals for connection to a power supply;

a third terminal for connection to a load;

a first plurality of transistors of a first conductivity type, ordinally numbered first through last, each having an input electrode and having common and output electrodes with a variably conductive path therebetween responsive to signal between its input and common electrodes, their variably conductive paths being serially connected in order of their numbering between said third and said first terminals with the common electrode of said first transistor connected to said first terminal and the output electrode of said last transistor connected to said third terminal;

a second plurality of transistors, ordinally numbered first through last, each being of a second conductivity type complementary to the first conductivity type, each having an input electrode and having common and output electrodes with a variably conductive path therebetween responsive to signal between its input and common electrodes, said variably conductive paths thereof being serially connected in order of their numbering so the output electrode of the last transistor in said second plurality is connected to the input electrode of the first transistor of said first plurality, the input electrode of said first transistor of said second plurality being connected to said third terminal;

a third plurality of transistors of said first conductivity type, ordinally numbered first through last, each having an input electrode and having a common and an output electrodes with a variably conductive path therebetween responsive to signal between its input and common electrodes, said variably conductive paths thereof being serially connected in order of their numbering between said third and said second terminals so the common electrode of the first transistor thereof is connected to said third terminal and so the output electrode of the last transistor thereof is connected to said second terminal;

a fourth plurality of transistors, ordinally numbered first through last, at least those following the first being of said second conductivity type, each having an input electrode and having a common and output electrodes with a variably conductive path therebetween responsive to signal between its input and common electrodes, said variably conductive paths thereof being serially-connected in order of their numbering between said second terminal and the base electrode of said first transistor of said third plurality so that the collector electrode of the last transistor in said fourth plurality is connected to the base electrode of the first transistor in said third plurality;

a fifth plurality of transistors, ordinally numbered from first to last, at least those following the first being of said second conductivity type, each having an input electrode and having common and output electrodes with a variably conductive path therebetween responsive to signal between its input and common electrodes, said variably conductive paths thereof being serially connected in order of their numbering so that the output electrode of the last transistor in said fifth plurality is connected to the common electrode of the first transistor in said second plurality;

means for applying a signal between the input and common electrodes of the first transistor in said fourth plurality;

means for supplying a signal between the input and common electrodes of said first transistor in said fifth plurality;

a first potential divider having an input circuit connected between said first and said third terminals and having a plurality of output taps each connected to a respective one of the base electrodes of the transistors in said first and said second pluralities except for their respective first transistors, thereby to apportion substantially equal potentials to the variably conductive paths of the transistors in said first plurality and substantially equal potentials to the variably conductive paths of the transistors in said second plurality;

a second potential divider having an input circuit connected between said third and said second terminals and having a plurality of output taps each connected to a respective one of the base electrodes of the transistors in said third and said fourth and said fifth pluralities except for their respective first transistors, thereby to apportion substantially equal potentials to the variably conductive paths of the transistors in said third plurality and substantially equal potentials to the variably conductive paths of the transistors in said fourth and said fifth transistors.

11. An amplifier as set forth in claim 10, wherein the first transistors of said fourth and said fifth pluralities are each of said second conductivity type, one of them being connected in common-base amplifier configuration to receive an input signal applied to its common electrode and the other of them being connected in common-emitter amplifier configuration to receive an input signal applied to its input electrode.

12. In combination:

a series amplifier comprising a first cascade of transistors, the principal conduction paths of which are connected in a first serial connection for direct current, and a potential divider for apportioning the potential appearing across said first serial connection to the control electrodes of all but the first transistors in said first cascade to cause the transistors in said first cascade to have substantially equal potentials across their principal conduction paths; and a second cascade of transistors, the principal conduction paths of which are in a second serial connection for direct current, and sharing said potential divider with said first series amplifier for apportioning the potential appearing across said first serial connection to the control electrodes of all but the first transistor in said second cascade to cause the transistors in said second cascade to have substantially equal potentials across their principal conduction paths, said second serial connection being connected to the control electrode of the first transistor of said first cascade thereby to cascade said first cascade after said second cascade.

13. In combination:

an input transistor, an inverting amplifier transistor of a first conductivity type, a first number at least one of transistors of said first conductivity type and a second number at least one of transistors of a second conductivity complementary to the first, each of said transistors havivng a control electrode and a variably conductive principal conduction path between a pair of other electrodes;

a potential divider having first and second input terminals and a plurality of output taps;

a first serial connection, of the principal conduction paths of said inverting amplifier transistor and said first number of transistors, being connected between the input terminals of said potential divider, with the principal conduction path of said inverting amplifier transistor being the one most closely connected to the first input terminal of the potential divider;

a second serial connection of the principal conduction paths of said input transistor and said second number of transistors being connected between the second input terminal of said potential divider and the control electrode of said inverting amplifier transistor;

means for connecting a respective one of the output taps of said potential divider to each of the control electrodes of said first number of transistors to apportion thereto the potential between the input terminals of said potential divider, thereby to cause substantially equal potentials across the principal conduction paths in said first serial connection; and means for connecting a respective one of the output taps of said potential divider to each of the control electrodes of said second number of transistors to apportion thereto the potential between the input terminals of said potential divider, thereby to cause substantially equal potentials across the principal conduction paths in said second serial connection.

14. A series amplifier comprising, in combination:

first and second terminals;

$n$, where $n$ is an integer, output transistors of the same conductivity type in a first cascade connection, each having common and output electrodes with a conduction path therebetween and having a control electrode for controlling the conductance of its conduction path, said conductio paths thereof being connected in series between said first and said second terminals, whereby when said transistors conduct a voltage $\overline{V}$ appears between said first and said second terminals;

$n$ input transistors in a second cascade connection, each having common and output electrodes with a conduction path therebetween and having a control electrode for controlling the conductance of its conduction path, said conduction paths thereof being connected in series between said second terminal and the control electrode of the output transistor connected to the first terminal;

means responsive to the voltage $\overline{V}$ appearing between said first and said second terminals for applying successive increments thereof, each of amplitude $\overline{V}/n$, to the control electrodes of all but the first of the n output transistors in said first cascade connection in the order of their succession therein, and to the control electrodes of all but the first of the $n$ input transistors in said second cascade connection in the order of their succession therein; and means for applying an input signal between the control electrode of the input transistor included in said second cascade connection and its electrode connected to said second terminal.

15. A series amplifier as set forth in claim 14 wherein said means responsive to said voltage comprises a voltage divider with $n-1$ taps, each tap connected to one output transistor control electrode and to one input transistor control electrode.

16. A series amplifier as set forth in claim 14 arranged in push-pull amplifier configuration with another transistor amplifier of the same type but with complementary conduction characteristics, their input signal terminals arranged for receiving push-pull input signals, their first terminals connected together for supplying a signal responsive to said push-pull input signals, their second terminals arranged for receiving an operating potential therebetween.

17. A series amplifier as set forth in claim 14 arranged in push-pull amplifier configuration with another transistor amplifier of the same type but with complementary conduction characteristics, their first terminals being connected together and their output transistors connected to their respective first terminals having their control electrodes direct current conductively coupled to each other.

18. A series amplifier as set forth in claim 14 being a first series amplifier in combination with a second series amplifier comprising:

a third terminal;

$n$ output transistors of said same conductivity type in a third cascade connection, each having common and output electrodes with a conduction path therebetween and having a control electrode for controlling the conductance of its conduction path, said conduction paths thereof being connected in series between said first and said third terminals whereby when said transistors conduct a voltage V appears between said first and said third terminals;

twice $n$ input transistors in a fourth cascade connection, each having common and output electrodes with a conduction path therebetween and having a control electrode for controlling the conductance of its conduction path, said conduction paths thereof being connected in series between said second terminal and the control electrode of the output transistor connected to said third terminal, the control electrodes of the $n-1$ successive transistors following the first transistor of this fourth cascade connection having their control electrodes connected to the control electrodes of the $n-1$ transistors following the first transistor in said third cascade connection, the control electrode of the $n+1$st transistor of this fourth cascade connection being connected to said first terminal;

means responsive to the voltage $\overline{V}$ appearing between said first and said third terminals for applying successive increments thereof, each of the amplitude $\overline{V}/n$, to the control electrodes of all but the first of the n output transistors in said third cascade connection in the order of their succession therein and to the control electrodes of the remaining $n-1$ transistors in said fourth cascade connection in order of their succession therein; and means for applying an input signal between the control electrode of the input transistor included in said fourth cascade connection and its electrode connected to said second terminal.

* * * * *